(12) United States Patent
Sugiyama et al.

(10) Patent No.: US 10,043,726 B2
(45) Date of Patent: Aug. 7, 2018

(54) EMBEDDED COMPONENT SUBSTRATE WITH A METAL CORE LAYER HAVING AN OPEN CAVITY AND PAD ELECTRODES AT THE BOTTOM OF THE CAVITY

(71) Applicant: TAIYO YUDEN CO., LTD., Tokyo (JP)

(72) Inventors: Yuichi Sugiyama, Tokyo (JP); Masashi Miyazaki, Tokyo (JP); Yutaka Hata, Tokyo (JP); Masashi Katakai, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/078,793

(22) Filed: Mar. 23, 2016

(65) Prior Publication Data

US 2016/0293537 A1 Oct. 6, 2016

(30) Foreign Application Priority Data

Mar. 31, 2015 (JP) ................. 2015-071280

(51) Int. Cl.
*H01L 23/14* (2006.01)
*H01L 23/13* (2006.01)
(Continued)

(52) U.S. Cl.
CPC .......... *H01L 23/13* (2013.01); *H01L 23/3121* (2013.01); *H01L 23/49822* (2013.01);
(Continued)

(58) Field of Classification Search
CPC ........................ H05K 3/4697; H05K 3/4608
(Continued)

(56) References Cited

U.S. PATENT DOCUMENTS 6,625,880 B2 * 9/2003 Nabemoto ............ H01L 21/481
228/180.21
8,410,614 B2 * 4/2013 Kunimoto ........... H01L 23/5389
257/685
(Continued)

FOREIGN PATENT DOCUMENTS

JP 2011-210930 A 10/2011
JP 2012-49577 A 3/2012
(Continued)

OTHER PUBLICATIONS

Japanese Office Action dated Dec. 5, 2017, in a counterpart Japanese patent application No. 2015-071280.

*Primary Examiner* — Marc Armand
*Assistant Examiner* — Younes Boulghassoul
(74) *Attorney, Agent, or Firm* — Chen Yoshimura LLP

(57) ABSTRACT

An embedded component substrate includes: a core layer; a first electrode provided on a top surface of the core layer with a first insulating layer therebetween; and a second electrode provided on a bottom surface of the core layer with a second insulating layer therebetween, wherein a cavity is formed in the embedded component substrate from a top surface thereof to expose the second insulating layer at a bottom of the cavity, wherein a placement region is defined on the bottom of the cavity, for accommodating an electronic component; and wherein the embedded component substrate further includes a pad electrode on a portion of the second insulating layer, exposed by the cavity, surrounding the placement region located on the bottom of the cavity, the pad electrode vertically protruding from a top surface of the exposed second insulating layer upwardly and being configured to electrically connect to the electronic component.

8 Claims, 9 Drawing Sheets

(51) Int. Cl.
  *H01L 23/31* (2006.01)
  *H01L 23/498* (2006.01)
  *H01L 23/538* (2006.01)
(52) U.S. Cl.
  CPC .............. *H01L 23/5389* (2013.01); *H01L 2224/48091* (2013.01); *H01L 2224/48465* (2013.01)
(58) Field of Classification Search
  USPC .................. 174/260, 257, 262, 258
  See application file for complete search history.

(56) References Cited

U.S. PATENT DOCUMENTS

| | | | | |
|---|---|---|---|---|
| 8,823,187 | B2* | 9/2014 | Shimizu | H01L 23/48 257/791 |
| 9,153,553 | B2* | 10/2015 | Tsuyutani | H01L 23/3121 |
| 9,232,657 | B2* | 1/2016 | Kiwanami | H05K 1/185 |
| 9,301,407 | B2* | 3/2016 | Miyazaki | H05K 3/4647 |
| 2008/0198552 | A1 | 8/2008 | Cho et al. | |
| 2008/0308308 | A1* | 12/2008 | Kobayashi | H01L 21/4853 174/257 |
| 2009/0126982 | A1* | 5/2009 | Nakamura | H01L 21/6835 174/262 |
| 2010/0044853 | A1* | 2/2010 | Dekker | B81C 1/00087 257/692 |
| 2010/0078205 | A1* | 4/2010 | Sakai | H01L 23/5389 174/260 |
| 2011/0203836 | A1* | 8/2011 | Yokota | H01L 24/18 174/250 |
| 2011/0240354 | A1* | 10/2011 | Furuhata | H01L 21/568 174/258 |
| 2014/0253794 | A1 | 9/2014 | Miyazaki et al. | |
| 2014/0307402 | A1* | 10/2014 | Sugiyama | H05K 1/185 361/761 |
| 2017/0019993 | A1* | 1/2017 | Tsai | H05K 1/115 |

FOREIGN PATENT DOCUMENTS

| | | |
|---|---|---|
| JP | 2013-51441 A | 3/2013 |
| JP | 2014-170893 A | 9/2014 |
| JP | 2014-220479 A | 11/2014 |

\* cited by examiner

EMBEDDED COMPONENT SUBSTRATE WITH A METAL CORE LAYER HAVING AN OPEN CAVITY AND PAD ELECTRODES AT THE BOTTOM OF THE CAVITY

BACKGROUND OF THE INVENTION

Technical Field

The present invention relates to an embedded component substrate and a semiconductor module.

Background Art

In past years, most semiconductor devices were packaged by mounting a bare chip on a lead frame and sealing the bare chip together with an island within the package. Packaging types such as SIP, DIP, and QFP were the norm, and many of these are still in common use even today because the leads protruding from the sealing resin reduce the effects of the difference in coefficient of thermal expansion between the motherboard and the chip itself.

However, miniaturization has proceeded at a rapid pace. Applications in mobile devices such as smartphones and tablet computers, for example, require small, thin packages with sophisticated functionality, and the semiconductor packaging technologies employed in such applications are constantly evolving. For example, packaging types such as BGA (a surface-mount technology in which a printed circuit board interposer is used to reduce mounting area) and MCP and POP (which facilitate miniaturization through use of 3D mounting techniques) are now widely used. These are all surface-mount technologies in which solder balls are used to replace the conventional protruding leads, thereby making it possible to achieve miniaturization and reduce mounting area. In the latter packaging types (MCP and POP), packages or chips are actually stacked on top of one another in order to achieve further reductions in mounting area.

Meanwhile, stemming from the ever-present demand for miniaturization, development of interposers and motherboards on which to mount such semiconductor packages has also proceeded actively, and thin substrates are now being developed as well. Modern smartphones, for example, utilize printed circuit boards with a 10-12 layer wiring layer and a thickness of approximately 400 µm.

Previously, electronic components and semiconductor packages were typically mounted on the surfaces of such multilayer printed circuit boards. Due to the increasingly demanding requirements from product manufacturers, however, in recent years there has been increased development of semiconductor modules in which embedded component substrates (printed circuit boards inside which components are embedded) are used as mounting substrates.

In this technology, a cavity is formed in the mounting substrate, and semiconductor devices and passive components are embedded within that cavity, thereby making it possible to achieve further reductions in the thickness of the semiconductor module itself.

FIG. 6 illustrates an example of this type of semiconductor module.

In this example, three layers of conductive patterns F1 to F3 are formed on the front surface of a core layer 11 made from a resin or metal with insulating layers interposed therebetween, and three other layers of conductive patterns B1 to B3 are formed on the rear surface of a core layer 11 with insulating layers interposed therebetween, thereby forming a six-layer substrate. A cavity 12 is formed in this mounting substrate 14, and a bare chip 13 is mounted within the cavity 12. Here, the bare chip 13 is an image sensor, and therefore the cavity 12 is not sealed with an insulating resin.

Moreover, here a "conductive pattern" refers to circuit wiring that includes pad electrodes and/or wiring or the like made from a conductive material.

As illustrated in FIG. 6, the electrodes of the bare chip 13 are connected to the pad electrodes F3 of the mounting substrate 14 via fine metal wires 15. However, due to the mechanical operation of the wire bonder, the fine metal wires 15 protrude out by a height d. As a result, when mounting a component 16 (an electronic component such as a semiconductor package, a case that holds a lens, or the like) on top of the mounting substrate 14, this height d will have a significant effect on the thickness of the overall semiconductor module 10.

RELATED ART DOCUMENT

Patent Document

Patent Document 1: Japanese Patent Application Laid-Open Publication No. 2014-170893

SUMMARY OF THE INVENTION

As illustrated in FIG. 7, one potential solution to this problem is to expose electrodes E1 on the bottom surface of the cavity 12 and wire-bond the fine metal wires 15 to those electrodes E1, thereby repositioning the highest points of the protruding portions within the substrate and reducing the thickness of the overall semiconductor module. However, because the entire electrodes E1 that function as the pads must be exposed from an insulating layer 17, those electrodes E1 exhibit poor adhesion and tend to peel off during the wire bonding process. Furthermore, if the surfaces of the pads E1 are coplanar with the surface of the insulating layer 17, the bonding tool will compress the insulating layer during the bonding process, which also tends to reduce the adhesion strength.

The present invention aims to make it possible to reduce the thickness of an embedded component substrate and a semiconductor module that uses the same while simultaneously improving adhesion between the fine metal wires and the pad electrodes positioned on the bottom surface of the cavity.

Accordingly, the present invention is directed to a scheme that substantially obviates one or more of the above-discussed and other problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides an embedded component substrate, including: a core layer; a first electrode provided on a top surface of the core layer with a first insulating layer interposed therebetween; and a second electrode provided on a bottom surface of the core layer with a second insulating layer interposed therebetween, wherein a cavity is formed in the embedded component substrate from a top surface thereof to expose the second insulating layer at a bottom of the cavity, wherein a placement region is defined on the bottom of the cavity, for accommodating an electronic component; and wherein the embedded component substrate further includes a pad electrode on a portion of the second insulating layer, exposed by the cavity, surrounding the placement region located on the bottom of the cavity, the pad electrode vertically protruding from a top surface of the exposed second insulating layer upwardly and being configured to electrically connect to the electronic component.

In another aspect, the present disclosure provides a semiconductor module, including: an embedded component substrate that includes a core layer made of a metal or a resin, a first electrode provided on a top surface of the core layer with a first insulating layer interposed therebetween, and a second electrode provided on a bottom surface of the core layer with a second insulating layer interposed therebetween, wherein a cavity is formed from a top surface of the embedded component substrate to expose the second insulating layer at a bottom of the cavity and expose side faces of the core layer at respective sidewalls of the cavity; a resin that covers the side faces of the core layer exposed at the sidewalls of the cavity and a boundary line between the exposed side faces of the core layer and the exposed second insulating layer; and a semiconductor device provided on the bottom of the cavity.

In another aspect, the present disclosure provides a method of manufacturing an embedded component substrate, including: preparing a core layer having a cavity penetrating from a top surface to a bottom surface; adhering a securing sheet to the bottom surface of the core layer so as to cover the cavity from below and placing a cavity mold on the securing sheet in the cavity; filling a resin into the cavity with the cavity mold in place; thereafter, removing the securing sheet; thereafter, providing a first electrode on the top surface of the core layer with a first insulating layer interposed therebetween at locations excluding the cavity, and providing, on the bottom surface of the core layer, a second electrode with a second insulating layer interposed therebetween at locations including the cavity, wherein a via that has a top surface in contact with a bottom surface of the cavity mold in the cavity and that is connected to the second electrode is formed in the second insulating layer; removing the cavity mold from above to expose the top surface of the via that is located in a bottom of the cavity; and forming, on the top surface of the via, a pad electrode that protrudes upward.

The exposed surface of the via is coplanar with the surface of the second insulating layer, and the pad electrode protrudes up towards one surface of the substrate. This makes it possible to make satisfactory bonding connections with the pad electrode without the capillary head of the bonding device hitting the second insulating layer.

Moreover, the pad electrode is formed to be larger than the via that is exposed on the bottom surface of the cavity. As a result, the via is sandwiched between the pad electrode and the third electrode, thereby further increasing the adhesion strength.

Furthermore, covering the exposed core layer in the cavity as well as the interface between the core layer and the second insulating layer with a resin makes it possible to prevent corrosion of the core layer and conductive patterns.

The present invention makes it possible to maintain bonding strength with fine metal wires while also lowering the highest points of the fine metal wires in the narrow space between a semiconductor device and the inner walls of a cavity.

Moreover, because this free space is present, the inner walls of the cavity are covered with an insulating resin, thereby making it possible to protect the core layer, conductive patterns, and the like.

Various aspects of the configurations described above make it possible to significantly inhibit problems such as peeling of the pad electrode, oxidation or corrosion of the core layer, and the like.

It is to be understood that both the foregoing general description and the following detailed description are exemplary and explanatory, and are intended to provide further explanation of the invention as claimed.

DETAILED DESCRIPTION OF EMBODIMENTS

Figure 1A:
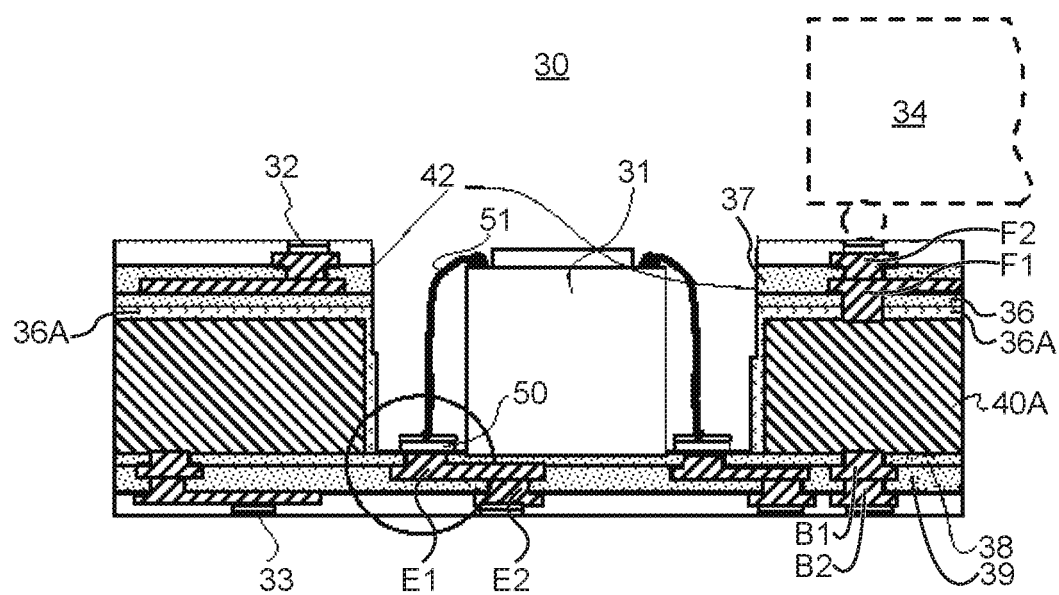
FIGS. 1A to 1D illustrate an embedded component substrate and a semiconductor module according to one aspect of the present invention.

First, a semiconductor module 30 in one aspect of the present invention will be described with reference to FIGS. 1A to 1D.

A semiconductor device 31 is embedded in a substrate to form an embedded component substrate. This embedded component substrate will be referred to as a substrate E in the following description. This E comes from the "E" in "Embedded."

The substrate E is also the semiconductor module. The semiconductor module 30 includes pad electrodes 32 formed on one of the surfaces of the substrate E, and an electronic component 34 is mounted by electrically connecting the electronic component 34 to the pad electrodes 32. Alternatively, the substrate may be a semiconductor module in which the electronic component 34 is not mounted on the surface, but a semiconductor device 31 is embedded in a cavity 42. Examples of electronic components include passive components such as chip capacitors and solenoids, active components constituted by semiconductor devices, sensors, filters, and the like. Moreover, pad electrodes 33 are formed on the other surface of the substrate to serve as external electrodes, and solder balls made from a brazing material are connected to these pad electrodes 33. In this case, the pad electrodes are plated multilayer films made from Au-plated Ni or the like so that a satisfactory solder joint can be formed. Ultimately, this semiconductor module 30 is solder-mounted to a motherboard that is embedded within a product.

When the present invention is applied to a camera module, the semiconductor device 31 is an image sensor, and the electronic component is an optics package. Such an optics package (not illustrated in the figures) would include a lens unit, an autofocus actuator formed around the lens unit, a filter unit formed on the bottom side of the lens unit, and a package that holds the lens unit, the actuator, and the filter unit fixed in place. This package would then be arranged on top of the semiconductor device.

As illustrated in FIG. 1A, the highest points of fine metal wires 51 are positioned completely within the interior of the substrate E or closer to the interior of the substrate than in conventional technologies, thereby making it possible to lower the optics unit positioned directly above the image sensor to be at the same level as the opening at the top of the cavity 42.

Next, the structure of the substrate E will be described. The substrate E includes a core layer 40 made from a metal foil, a metal plate, or a resin material. FIG. 1A depicts a case in which a core layer 40A that is made from a metal is used. Moreover, FIG. 1C (described below) depicts a case in which a core layer 40B that is made from a resin is used. Here, a metal such as Cu, Al, or Fe or an alloy composed primarily thereof may be used.

Figure 3A:
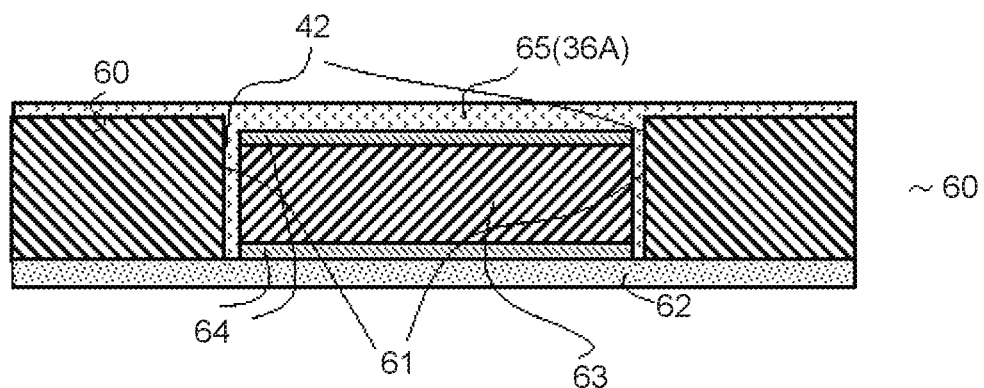
FIGS. 3A to 3C illustrate a method of manufacturing the embedded component substrate and the semiconductor module according to one aspect of the present invention.

Next, first electrodes F1 and F2 are formed on one surface (the front surface) of the core layer 40A with first insulating layers 36 and 37 interposed therebetween. Moreover, second electrodes B1 and B2 are formed on the other surface (the rear surface) of the core layer 40A with second insulating layers 38 and 39 interposed therebetween. A resin 36A that also functions as a sealing material is formed. If the first insulating layer 36 can adhere to the core layer 40A by itself, the resin 36A may alternatively be omitted. As will be described later as part of the method of manufacturing and as illustrated in FIG. 3A, the resin 36A supports and seals a cavity component 63 (cavity mold), provides corrosion protection for the core layer 40A, and covers the interface between the core layer and the insulating layer, thereby protecting the conductive patterns positioned at that interface.

Here, a total of four metal layers are formed on the front and rear surfaces of the core layer, but any total number of layers may be formed as long as that number is at least two. Moreover, here the conductive pattern is constituted by electrodes and/or wires, and the circuits to be formed in the substrate E are integrated together with the electronic components to be mounted.

Next, a cavity 42 is formed in the front side of the substrate E. The cavity 42 functions as a placement region for placing the semiconductor device (electronic component) 31. The core layer 40A and the semiconductor device 31 are left separated in order to form spaces therebetween, and these spaces provide regions for the wires to run through. If the semiconductor device is mounted in a face down orientation, the spaces between the core layer 40A and the semiconductor device 31 may be made even narrower. Moreover, because the semiconductor device 31 is an image sensor, the cavity 42 is not filled with a sealing resin. In general, an inorganic filler is mixed into the sealing resin in order to adjust the coefficient of thermal expansion. However, because this type of filler can cause light scattering, a sealing resin should not be formed in the cavity 42 if the semiconductor device 31 is an image sensor. As an exception to this, light-receiving optical elements such as photodiodes do not require the same type of precision as image sensors and generally only have an ON and OFF state indicating whether or not light has been received, and thus a sealing resin that contains little or no filler may be formed on the front surface of the semiconductor device and filled into the open spaces.

Furthermore, if the semiconductor device 31 is a standard semiconductor device that does not include a sensor element (such as an IC or a discrete device), the cavity is filled with an insulating resin, thereby sealing in the semiconductor device 31. This insulating resin may contain an inorganic filler in order to compensate for the difference in coefficient of thermal expansion between the semiconductor device 31 and the substrate E.

Third electrodes E1 and E2 are formed on the bottom surface of the cavity 42 using the same process used for the second electrodes B1 and B2. Moreover, the third electrodes E1 (which are closest to the core layer 40A) are exposed on the bottom surface of the cavity.

Figure 1B:
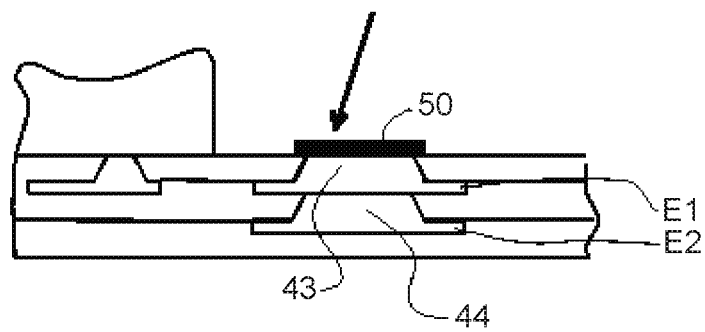

FIG. 1B illustrates an enlarged view of this portion. As illustrated in FIG. 3C, the core layer 40A (the cavity component 63) contacts a via, and therefore this exposed portion functions as a bonding surface (a contact surface) of the via 43. The surface of the second insulating layer 38 and the front surface of the via (the contact surface) are coplanar. This portion of the via may also be over-etched in order to form a slight recess.

Furthermore, at least one layer of plating treatment is applied to the front surface of the via that is exposed from the second insulating layer 38 (or the bottom surface of the cavity 42), and this plated layer functions as a bonding pad (pad electrode) 50.

The portion E1 illustrated in FIG. 1B is typically known as a via hole or a via. Here, a via refers to the portion formed by filling a conductive material into a via hole, and the pad-on-via portion beneath the via will be referred to as an electrode. This distinction needs to be made in order to clearly describe how the via is exposed at the bottom of the cavity.

The abovementioned plating treatment may be performed as part of the same process for plating the pad electrodes 32 and 33. However, the diameter of the pad electrode 50 on the via 43 is formed larger than the via diameter for the pad electrodes 32 and 33 because the fine metal wires will be connected to the pad electrode 50. Moreover, the bonding area of the via 43 may be formed larger than the bonding area of the pad electrodes 32 and 33.

A first characteristic of the present invention is that the pad electrode 50 has a protrusion-shaped structure that protrudes up from the surface of the second insulating layer 38, and the thickness of the pad electrode 50 is set such that the bonding head of the bonding device will not hit the surface of the second insulating layer 38 during the bonding process. The figures depict a case in which ball bonds are formed on the semiconductor device 31 and stitch bonds are formed on the pad 50. However, ball bonds may also be formed on the pad 50, and stitch bonds may also be formed on the semiconductor device 31. It is preferable that the pad electrode 50 be made from Ni/Au, for example, when the fine metal wires 51 are made from gold. The pad electrode may be made from Ni, for example, when the fine metal wires 51 are made from aluminum. It is preferable that the pad 50 be made from Cu when the fine metal wires 51 are made from copper. The pad electrode 50 is typically formed as a plating film with a thickness of approximately 5 to 20 µm. Moreover, a plating film that exhibits excellent contact with the fine metal wires is selected.

A second characteristic is that the pad electrode 50 is larger than the periphery of the via 43 that is exposed from the second insulating layer 38. In FIG. 1B, the pad electrode 50 is the structure with overhanging portions indicated by the black rectangle.

To make the bonding connection, an impact is applied to the pad electrode 50 in the front-to-rear direction of the substrate E in order to connect a fine metal wire to the pad 50. Next, when tearing off the fine metal wire from the pad electrode 50, a force is applied in the pad electrode 50-to-front direction in order to tear the fine metal wire 51 from the connection site.

Figure 7:
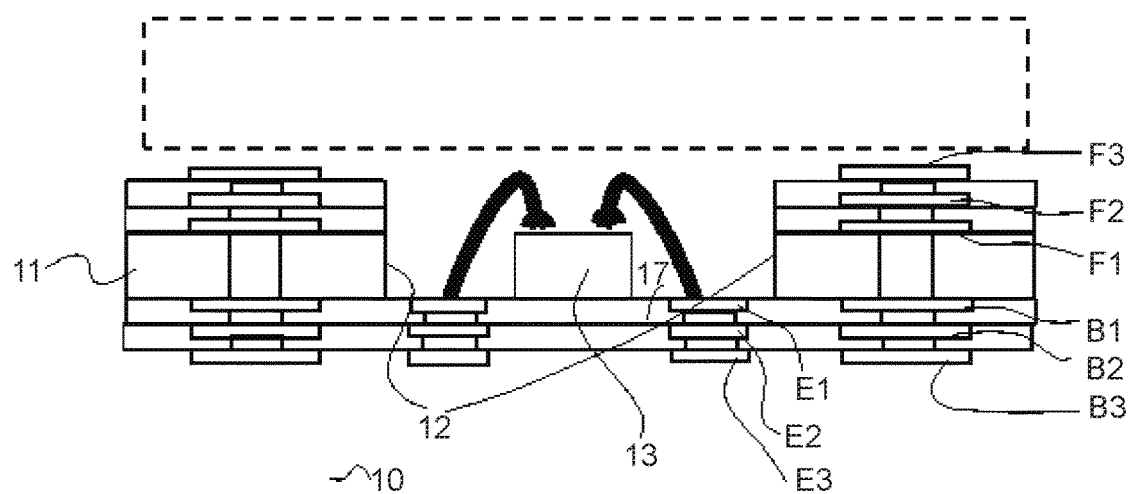
FIG. 7 illustrates a conventional semiconductor module.

In the configuration illustrated in FIG. 7 that does not include the pad electrodes 50, the electrodes E1 are prone to peeling off or separating from the second insulating layer when a large upward or downward force is applied. However, the present invention is much less prone to this problem because the via 43 is sandwiched between the third electrode E1 and the pad electrode 50.

A third characteristic of the present invention is the shape of the via 43. FIG. 1B is an enlarged view of this portion. The via 43 has a tapered shape that tapers towards the surface at the bottom of the cavity 42. The tapered cross-sectional shape of the via 43 becomes narrower moving towards the cavity 42. Therefore, when tearing off the fine metal wires, the structure of the via provides resistance against the force used.

Figure 6:
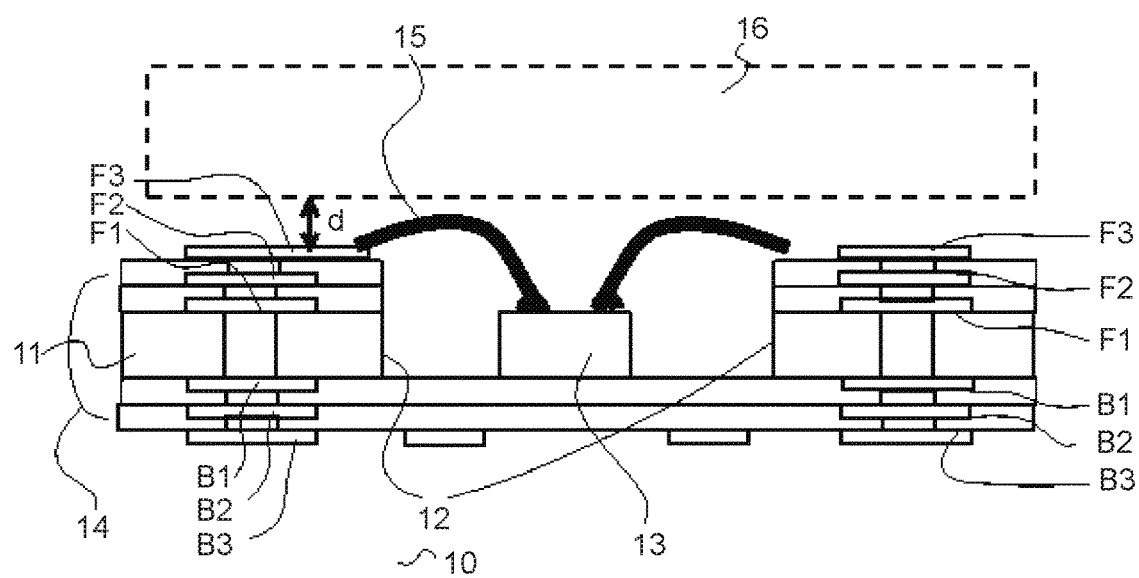
FIG. 6 illustrates a conventional semiconductor module.

As is clear from the description above, connecting the other ends of the fine metal wires 51 to the bottom of the cavity 42 makes it possible to lower the highest points of the fine metal wires 51 in comparison with conventional technologies (such as that illustrated in FIG. 6). Furthermore, the pad electrode 50 is larger than the periphery of the via 43 and protrudes up from the via 43 with a prescribed thickness, the via 43 has a tapered shape that tapers towards the pad electrode 50, and the pad electrode 50 and the third electrode E1 are formed sandwiching the second insulating layer 38. This makes it possible to significantly inhibit problems such as peeling of the pad electrode 50.

Figure 4A:
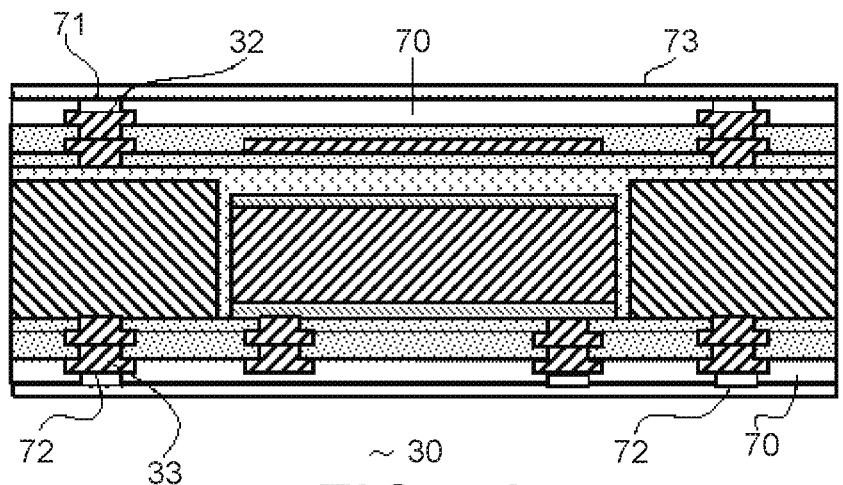
FIGS. 4A to 4C illustrate a method of manufacturing the embedded component substrate and the semiconductor module according to one aspect of the present invention.

Meanwhile, in the substrate 30 that uses the metal core layer 40A, when forming the cavity 42 in the substrate 30 illustrated in FIG. 4A, in most cases a process such as machining or etching is used to form the opening, thereby exposing the core layer 40A. In this case, if the semiconductor device 31 is a sensing device or the like and spaces are left so that the sensing device can receive signals (such as light) from above, the external atmosphere tends to infiltrate those spaces and cause oxidation or corrosion of the core layer 40A. However, in one aspect of the present invention, the core layer 40A in the cavity 42 is covered by the sealing resin (or coating resin) 36A, thereby making it possible to solve this problem.

Furthermore, components of the external atmosphere such as moisture tend to collect at the bottom of the cavity 42, and the external atmosphere tends to infiltrate the interface (boundary) between the core layer 40A and the second insulating layer 38. This can potentially cause corrosion of the conductive patterns running along this interface. However, in one aspect of the present invention this interface is coated with the coating resin 36A, thereby solving the problem of corrosion.

In FIG. 1A, the resin 36A is shown partially covering the sidewalls of cavity 42, but the resin 36A may also be formed covering all of the sidewalls of the cavity 42.

Figure 1C:
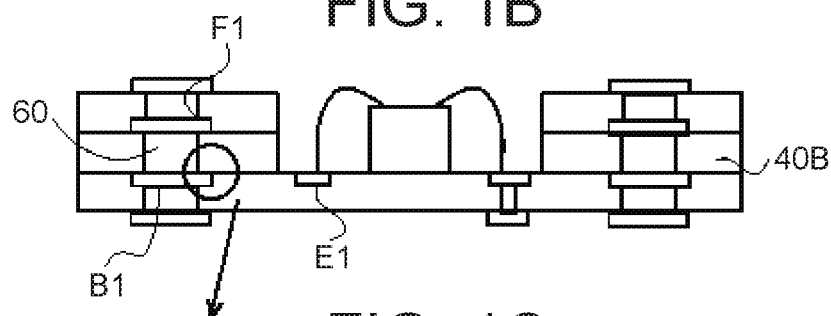
Figure 1D:
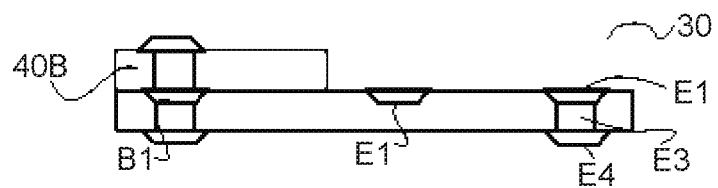

Next, a substrate in which the core layer is made from a resin will be briefly described with reference to FIGS. 1C and 1D. In this case, vias 60 are formed going through the core layer 40B, and first electrodes F1 and second electrodes B1 are formed on each side of the vias 60 using a patterning process. As illustrated in FIG. 1D, here the electrodes E1 have a structure that gets wider moving upwards, thereby making these electrodes prone to getting pulled out. However, as illustrated by the electrode on the right side of the cavity, a via and an electrode E4 are formed beneath the electrode, thereby making it possible to solve this problem.

Moreover, forming a plating layer that protrudes up and has overhanging portions on top of the electrodes E1 makes it possible to achieve the same effects described above in this type of substrate as well.

Next, a method of manufacturing the embedded component substrate or semiconductor module that uses the metal core layer 40A as illustrated in FIG. 1A will be described.

Figure 2A:
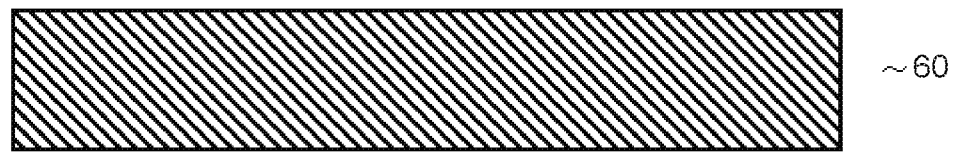
FIGS. 2A to 2C illustrate a method of manufacturing the embedded component substrate and the semiconductor module according to one aspect of the present invention.

First, as illustrated in FIG. 2A, a core material 60 that will function as the core layer 40A is prepared. This core material is made from Cu or a metal material composed primarily of Cu. Alternatively, the core material may be made from Fe, Al, or an alloy composed primarily of Fe or Al. This metal core material contributes significantly not only to the thermal conductivity of the substrate E but also to the flatness of the substrate E. This is because metal core layers typically have higher rigidity and better material stability than resin core layers. The semiconductor chips used for image sensors or usual semiconductor ICs are thin and have a large mounting area and a large number of external terminals that need to be electrically connected, and therefore warping of the substrate E itself can affect the semiconductor chip. Here, however, the substrate E itself is very flat, thereby improving the reliability of the image sensor. More specifically, using a metal core layer tends to reduce packaging defects.

Figure 2B:
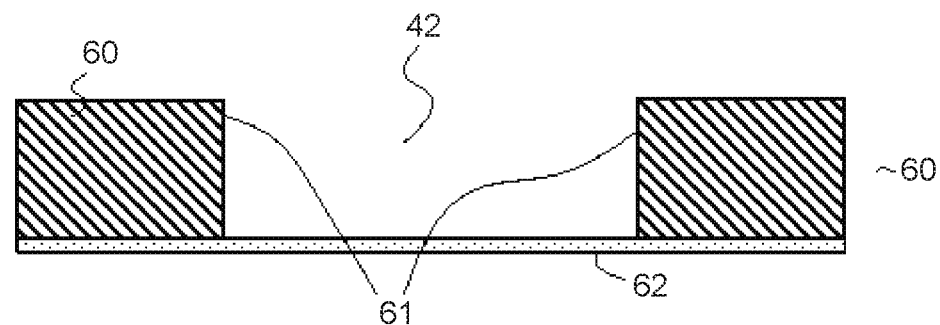

Next, as illustrated in FIG. 2B, a cavity 42 is formed going through the core material 60 from front to back using an etching process, and a temporary securing sheet 62 is adhered to the core material 60 covering at least a rear side opening 61 of the cavity 42. Here, the temporary securing sheet 62 is adhered over the entire rear surface of the core material.

The cavity 42 provides a region in which to embed the semiconductor device 31. Moreover, additional cavities for embedding chip capacitors, solenoids, or the like may be formed as necessary. As illustrated in FIG. 2B, the purpose of the temporary securing sheet 62 is to provide a surface to which to fix the cavity component 63 (the cavity mold). The temporary securing sheet 62 also prevents leakage of a sealing resin 65.

Figure 2C:
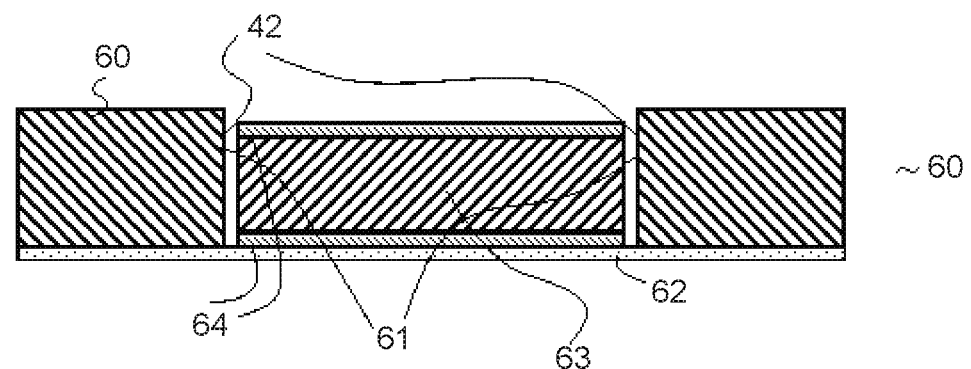

Next, wiring layers are formed on both surfaces of the core material 60. However, if the wiring layers are applied while the cavity 42 is still empty, the surface of the substrate E may get warped. Therefore, as illustrated in FIG. 2C, the cavity component 63 is prepared and embedded in the cavity 42. The cavity component 63 is a dummy component made from the core material and will be removed later.

Moreover, the cavity component 63 includes a Cu core with Ni plating films 64 formed on both the front and rear surfaces thereof. Here, Ni is used in order to prevent the third electrodes E1 and the vias 43 (which are made from Cu) from getting etched. The vias 43 are protected from etching by using a material other than copper for the plating films and selecting an etchant with the appropriate selectivity. Ni is also harder than copper, and therefore forming Ni plating films on both surfaces of the cavity component increases the rigidity of the cavity component and helps maintain the flatness of the substrate itself.

A metal other than Ni such as Ag, Au, or Ti may also be used as long as the selected metal is different than Cu.

Next, as illustrated in FIG. 3A, the sealing resin 65 is filled into the spaces between the inner walls of the cavity 42 and the cavity component 63 such that the surface of the core material 60 becomes flat, particularly in the area where the cavity opening is formed. Using a B-stage sheet as the sealing resin 65 during the sealing process makes it possible to form a thin resin sheet over the entire front surface of the core material 60 including the opening. This thin sheet can then be softened and press-fitted into the cavity. As a result, an extremely thin layer of this resin remains on top of the core material. However, a configuration in which the sealing resin is not formed on top of the core material may also be used.

Figure 3B:
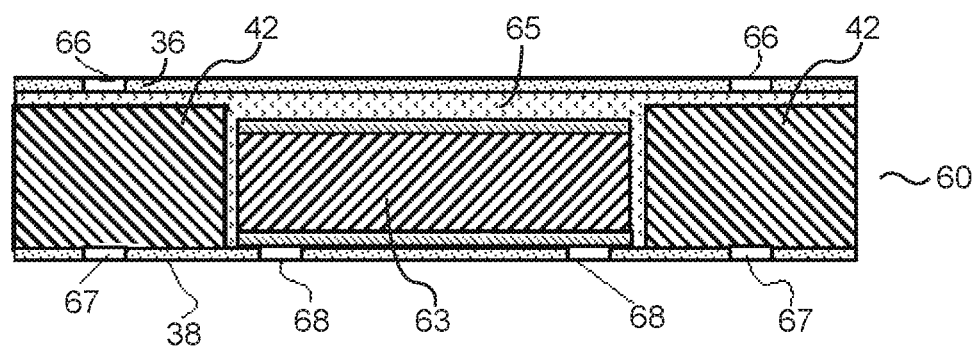
Figure 3C:
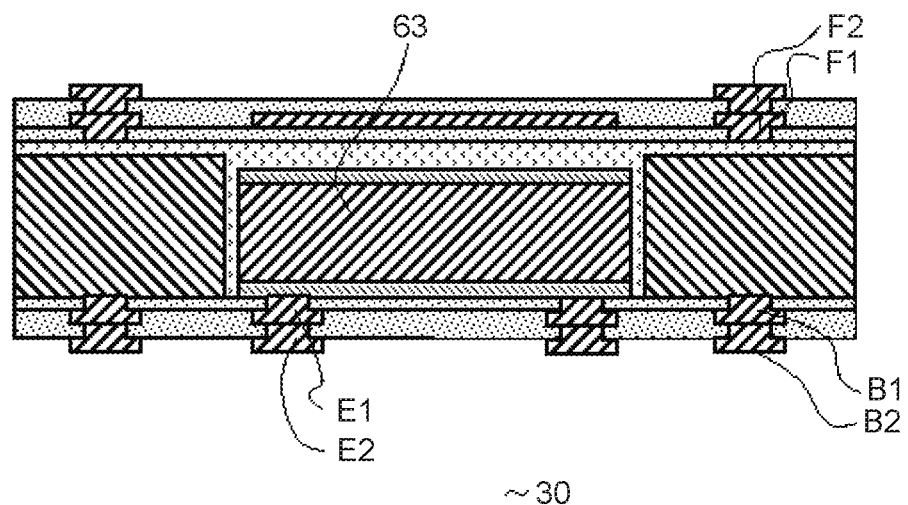

Next, as illustrated in FIG. 3B, the temporary securing sheet 62 is peeled off, and a first insulating layer 36 and a second insulating layer 38 that are made from a resin material are formed. These insulating layers may be made from any material that is commonly used in printed circuit boards, and a material that can be patterned using photolithography or a material in which openings can be formed using a laser may be used. In either case, portions of the material are removed using wet etching or a laser ablation in order to form openings 66 to 68. These openings correspond to the vias 43 described in reference to FIGS. 1A to 1D. The etching conditions or laser irradiation conditions can also be adjusted to give the openings the tapered shape that tapers towards the core material as illustrated in FIG. 1B.

Next, as illustrated in FIG. 3C, a copper plating treatment is applied to the openings 66 to 68 in order to form the first electrodes F1, the second electrodes B1, and the third electrodes E1. Typically, an electroless Cu plating treatment is applied, and then a Cu electroplating treatment is applied in order to cover the entire surfaces with Cu, which is then etched to form the wiring patterns.

Furthermore, a first insulating layer 37 and a second insulating layer 39 made from a resin material are formed as second layers, and via holes 44 are formed in these layers using the same process described above. Next, a plating treatment is applied to these via holes to form Cu plating films in the vias 44 and on the surfaces of the insulating layers, and then the same etching process described above is used to form first electrodes F2, second electrodes B2, and third electrodes E2.

In one aspect of the present invention, two layers of electrode patterns are formed on both the upper and lower surfaces of the substrate. However, a number of layers other than two may be formed on the upper and lower surfaces of the substrate by repeating the same process described above.

Next, as illustrated in FIG. 4A, a solder resist 70 is formed over both surfaces of the substrate 30, and openings 71 and 72 (in which plating layers for making solder joints will be formed) are formed and Ni and Au plating treatments will be applied to the surfaces of the pad electrodes 32 and 33 through these openings in order to form regions for making solder joints. In addition, protective sheets 73 are formed over the entire front and rear surfaces to cover these openings. These protective sheets 73 are used to prevent corrosion of the pad electrodes 32 during the following processes, in which an etching process or a machining process will be applied to remove the cavity component (the cavity mold).

Figure 4B:
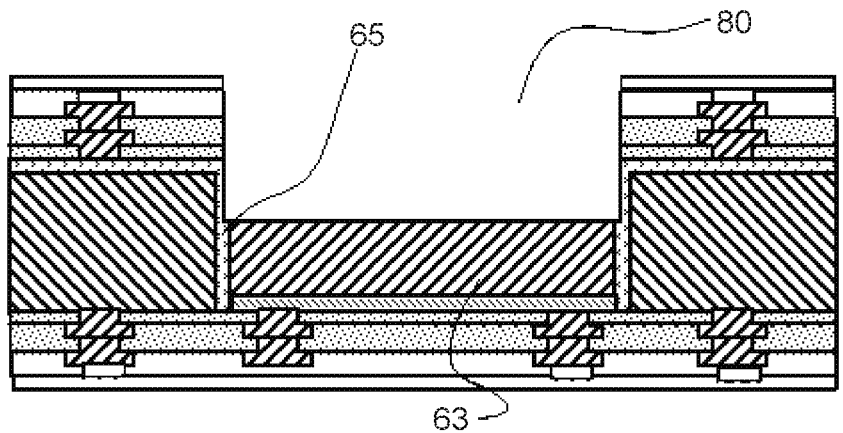
Figure 4C:
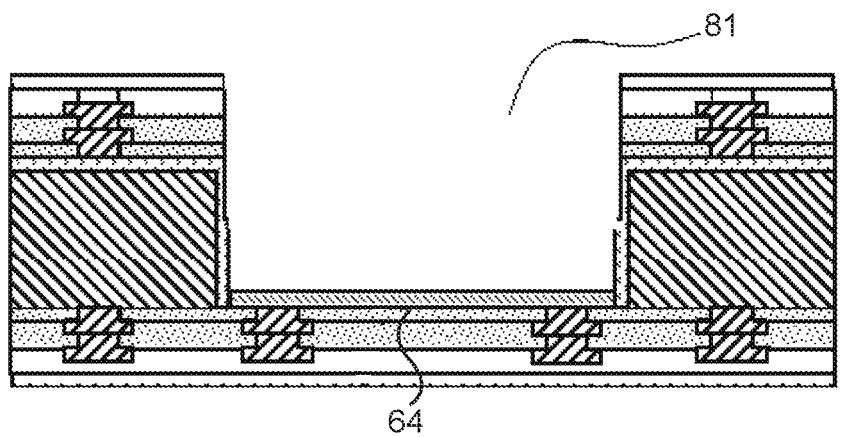

Next, as illustrated in FIGS. 4B and 4C, the cavity component 63 is removed. This process has two steps. This is because a resin layer is formed as the upper layer of the cavity component 63. First, a first space 80 is formed using an etching process or a mechanical process for forming an opening (such as drilling or a laser process), thereby exposing the Cu. Next, an etching process is then performed to remove just the Cu. As illustrated in FIG. 4B, the first space exposes the Cu, and the rest of the exposed portions are made from a resin.

In other words, the inner walls of the first space 80 around the remaining portion of the cavity component 63 are covered by the sealing resin 65 and the interlayer insulating layers, and the front and rear surfaces of the substrate E are covered by the protective resist. Therefore, using an etchant such as ferric chloride during the etching process etches away just the cavity component and does not etch the other exposed portions. The first space 80 is formed slightly larger than the cavity component 63, such that the resulting opening extends into the sealing resin 65 but does not expose the core layer 40A.

Doing this ensures that when the rest of the cavity component 63 is removed, the Ni film 64 will remain at the bottom of a second space 81 because the etchant does not etch Ni and is only selective for copper.

Figure 5A:
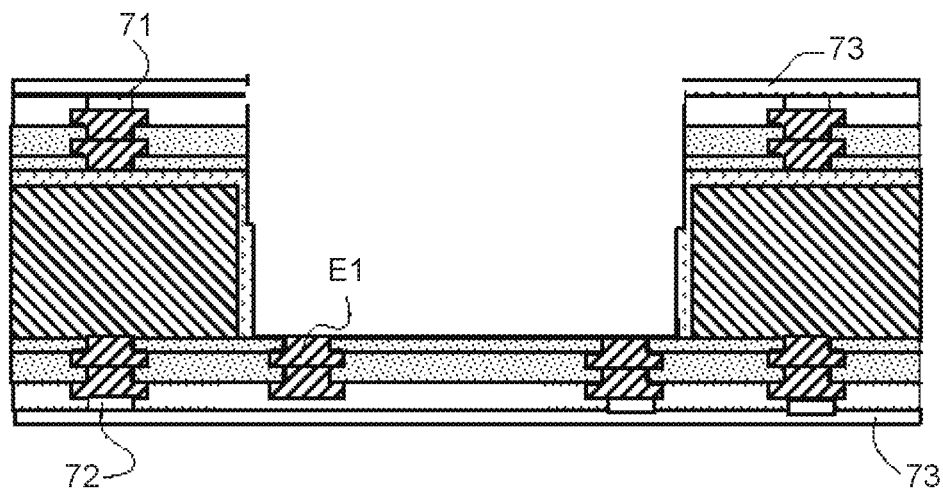
FIGS. 5A and 5B illustrate a method of manufacturing the embedded component substrate and the semiconductor module according to one aspect of the present invention.

Next, as illustrated in FIG. 5A, the Ni film is etched away using an Ni etchant. As a result, the third electrodes E1 are exposed on the surface of the second insulating layer 38 without getting etched.

Figure 5B:
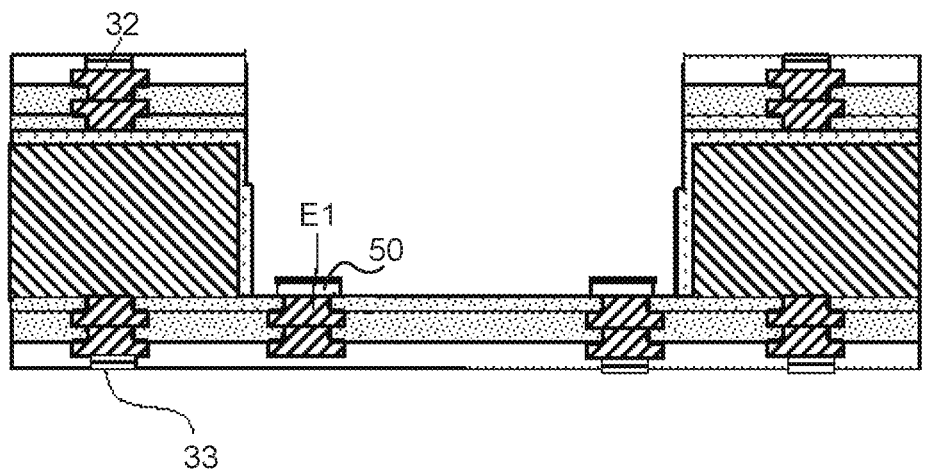

Then, as illustrated in FIG. 5B, the protective resist 73 is removed, and plating films that make good contact with solder are formed in the openings 71 and 72 to form the pad electrodes 32, 33, and 50. Here, an Ni plating treatment is performed and followed by an Au plating treatment. However, other types of plating films may be used. Any type of plating treatment may be used as long as the resulting plating films make good contact with solder joints.

Here, as described in reference to FIG. 1B, the plating films have a structure that improves resistance against impacts during wire bonding.

In other words, the pad electrodes 50 have a protrusion-shaped structure that protrudes up from the surface of the second insulating layer 38, and the thickness of the pad electrodes 50 is set such that the bonding head of the bonding device will not hit the surface of the second insulating film during the bonding process.

A second characteristic is that each pad electrode 50 is larger than the periphery of the respective via 43 that is exposed from the second insulating layer 38. In FIG. 1B, the pad electrode 50 is the structure with overhanging portions indicated by the black rectangle. The via 43 is sandwiched between the third electrode E1 and the pad 50, thereby improving adhesion strength.

A third characteristic of the present invention is the shape of the via 43. FIG. 1B is an enlarged view of this portion. The via 43 has a tapered shape that tapers towards the surface at the bottom of the cavity 42. The tapered cross-sectional shape of the via 43 becomes narrower moving towards the cavity 42. Therefore, when tearing off the fine metal wires, the structure of the via 43 provides resistance against the force used.

As is clear from the description above, connecting the other ends of the fine metal wires 51 to the bottom of the cavity 42 makes it possible to lower the highest points of the fine metal wires 51 in comparison with conventional technologies (such as that illustrated in FIG. 6). Moreover, the pads 50 protrude up and have overhanging portions, thereby making it possible to significantly inhibit problems such as peeling.

As illustrated in FIG. 1A, the rear surface of the semiconductor device 31 is fixed to the bottom of the cavity 42, and the pad electrodes 50 and the electrodes of the semiconductor device 31 are connected via fine metal wires 51. The pad electrodes 50 are exposed between the semiconductor device 31 and the sidewalls of the cavity 42. This gap is required in order to be able to insert the bonding tool (such as a capillary) of the bonding device.

Moreover, here the semiconductor device 31 is a device for receiving external light such as an image sensor or a light-receiving optical element (such as a PN photodiode), for example. Therefore, a sealing material is not applied to the front surface of the semiconductor device 31 or to the open spaces around the semiconductor device 31.

However, if a normal semiconductor device (such as a FET, TR, or IC) that does not include a light-receiving portion is placed in the cavity 42, the front surface of the semiconductor device 31 and the open spaces around the semiconductor device 31 may be left as-is or may be filled in with the sealing material.

Moreover, positioning the highest points of the fine metal wires below the front surface of the substrate 30 makes it possible to increase mounting efficiency for components mounted on this surface. However, the highest points may also be left protruding upwards slightly.

Next, the pad electrodes 50 will be described in more detail with reference to FIGS. 8 to 10C. The pad electrodes 50 must have an area large enough to be electrically connected to the fine metal wires 51 using a bonding tool. The area of the pad electrodes 50 is set as appropriate according to the diameter of the fine metal wires and the dimensions of the capillary.

Figure 8:
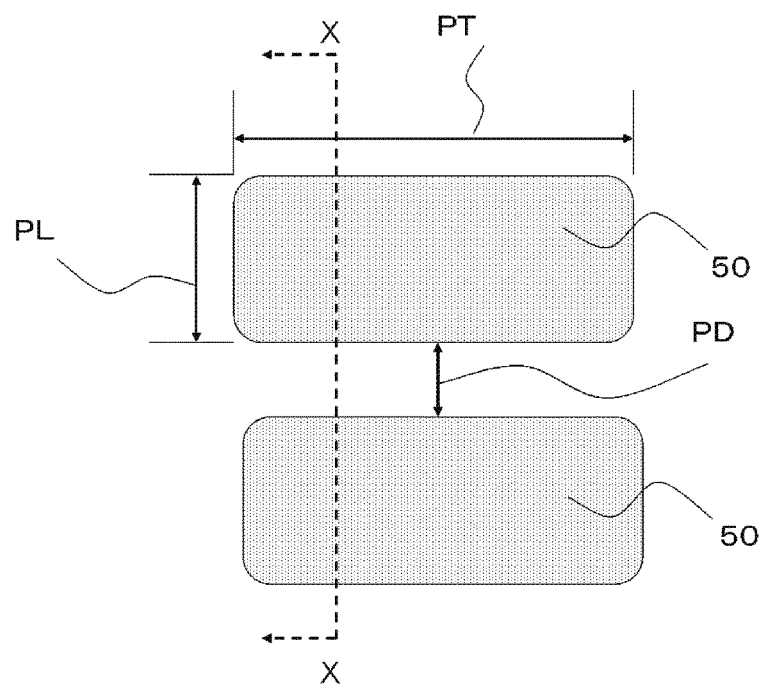
FIG. 8 illustrates the embedded component substrate and pad electrodes according to one aspect of the present invention.

FIG. 8 is a top view of the pad electrodes 50 illustrated in FIG. 5B with the pad electrodes 50 aligned in the direction going into the page. In FIG. 8, PT is the length of the long sides of the pads, PL is the length of the short sides of the pads, and PD is the distance between the pads. When the fine metal wires 51 used in the present working example have a diameter of approximately 20 μm, for example, PT is set to approximately 300 μm, PL is set to approximately 90 μm, and PD is set to approximately 60 μm. The substantially rectangular shape of the pad electrodes 50 can be formed by using a laser process such as trepanning, for example.

Figure 9:
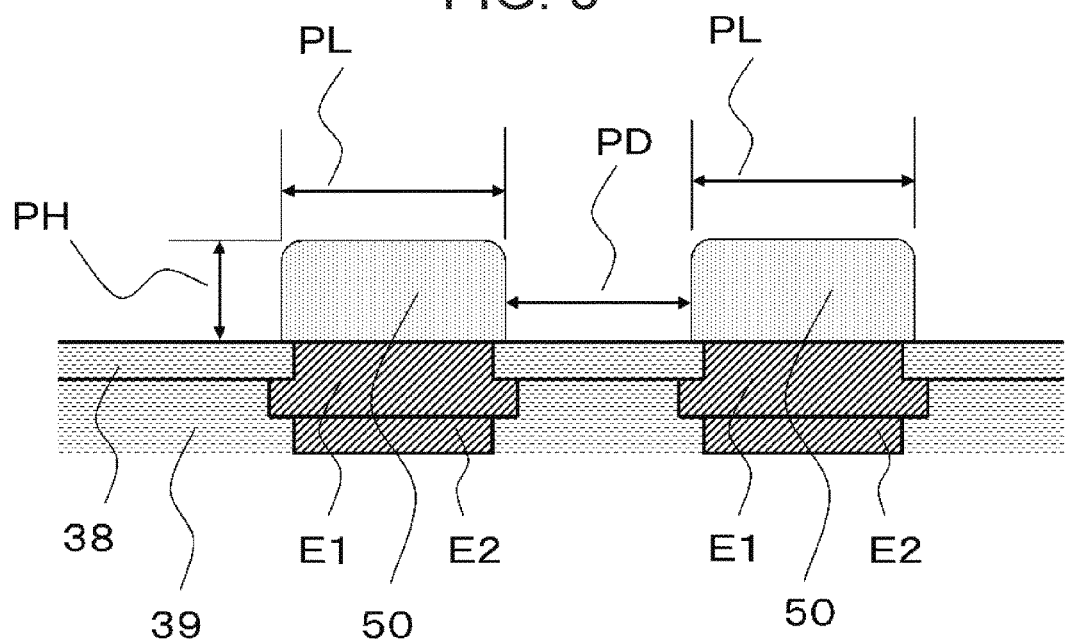
FIG. 9 is a cross-sectional view illustrating the embedded component substrate and the pad electrodes according to one aspect of the present invention.

FIG. 9 is a cross-sectional view taken along the dashed line X in FIG. 8 in the direction going into the page. As illustrated in FIG. 9, the pad electrodes 50 are formed on top of the third electrodes E1. In the present working example, the height PH of the pad electrodes can be set to approximately 2 to 20 μm, for example. As described above, the pad electrodes 50 are formed using metal plating treatments and have a multilayer structure. However, this layered structure is not illustrated in FIG. 9. For example, this multilayer structure may be constituted by the third electrode E1, which is copper, Ni plating on the third electrode E1, and Au plated on this Ni plating.

Figure 10A:
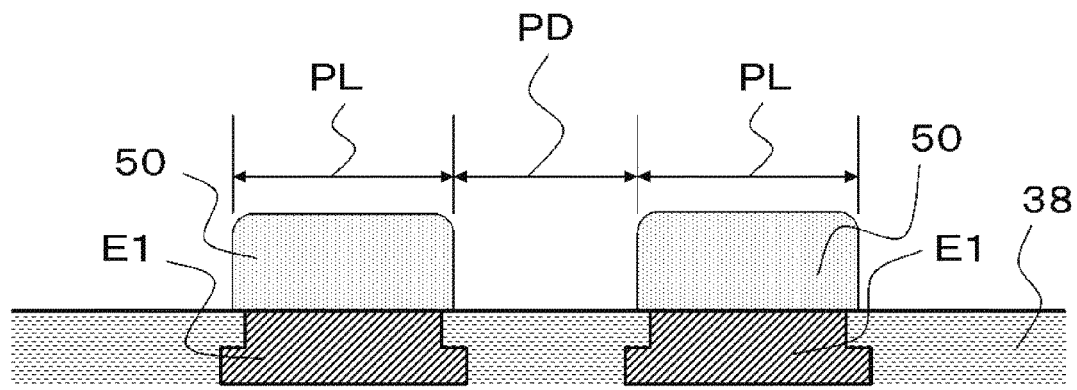
FIGS. 10A to 10C are cross-sectional views illustrating the pad electrodes.
Figure 10B:
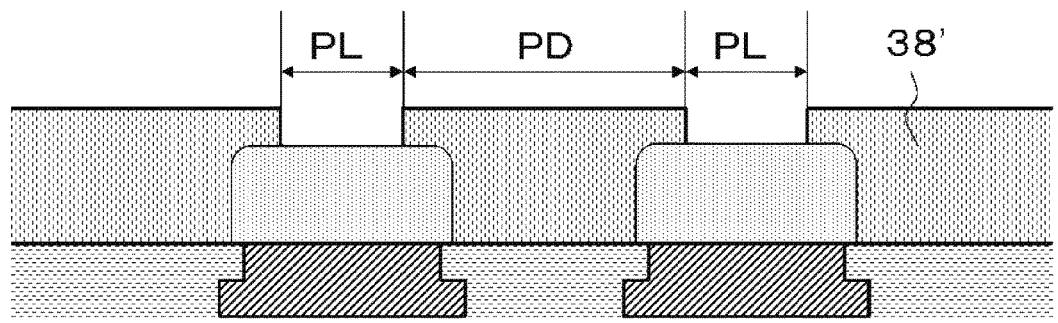
Figure 10C:
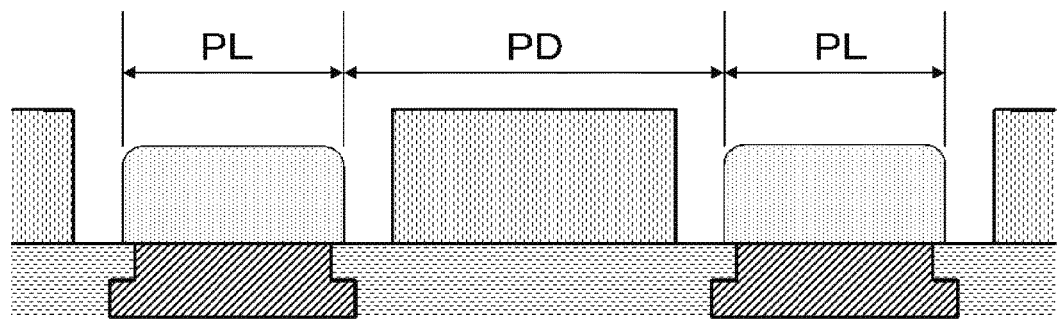

FIGS. 10A to 10C contain cross-sectional views comparing the pad electrodes of the present working example as illustrated in FIG. 9 to comparison examples. FIG. 10A illustrates the configuration of the present working example. FIGS. 10B and 10C illustrate configurations of comparison examples. In the comparison illustrated in FIG. 10B, a third insulating layer PSR (photo solder resist) needed to be formed surrounding the pad electrodes 50 in order to maintain electrical insulation between those pad electrodes. In this case, the area available for bonding on the pad electrodes 50 when bonding the fine metal wires 51 thereto is reduced. FIG. 10C illustrates a comparison for solving this problem. In this comparison example, the two pad electrodes 50 are separated by a distance PD, thereby making it possible to maintain electrical insulation between the pads while also providing a larger area for bonding. However, the structure of the comparison example illustrated in FIG. 10C decreases the density at which the pad electrodes 50 can be formed. In order to solve these problems, the present working example as illustrated in FIG. 5B does not include the third insulating layer illustrated in FIGS. 10B and 10C. This makes it possible to provide a larger area for bonding on the pad electrodes 50 and also reduce the distance PD between the pad electrodes, thereby making it possible to form the pad electrodes 50 at a high density in the cavity.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. An embedded component substrate, comprising:
a core layer made of a metal;
a first insulating layer on a top surface of the core layer;
a first electrode on the first insulating layer;
a second insulating layer on a bottom surface of the core layer;
a second electrode on a bottom surface of the second insulating layer,
wherein a cavity is formed in the embedded component substrate from a top surface thereof to expose the second insulating layer at a bottom of the cavity so that a top of cavity creates an opening on the top surface of the embedded component substrate,
wherein a placement region is defined on the bottom of the cavity, for accommodating an electronic component;
wherein the second insulating layer has at least one first via positioned directly under the core layer, a front surface of said at least one first via being flush with a top surface of the second insulating layer that is in contact with the bottom surface of the core layer so that the first via is directly in contact with the core layer thereabove,
wherein the second insulating layer has at least one second via positioned under the cavity, and
wherein the embedded component substrate further comprises a pad electrode directly on the second via in the cavity, adjacent to the placement region located on the bottom of the cavity, the pad electrode vertically protruding from a top surface of the exposed second insulating layer upwardly and being configured to electrically connect to the electronic component.

2. The embedded component substrate according to claim 1, further comprising a third electrode on a back surface of the second insulating layer, wherein the third electrode is electrically connected to the second via formed in the second insulating layer that is in turn connected to the pad electrode.

3. The embedded component substrate according to claim 2, wherein the third electrode is larger than the second via in a plan view.

4. The embedded component substrate according to claim 3, wherein the pad electrode is larger than the second via in the plan view.

5. The embedded component substrate according to claim 2, wherein the second via has a tapered shape that becomes narrower toward a top.

6. A semiconductor module, comprising:

the embedded component substrate according to claim 1; and a semiconductor device as said electronic component provided in the placement region in the cavity of the embedded component substrate, the semiconductor device having an electrode formed on a top thereof that is connected to the pad electrode via a fine metal wire.

7. A semiconductor module, comprising:

an embedded component substrate that includes a core layer made of a metal, a first insulating layer on a top surface of the core layer, a first electrode provided on the first insulating layer, a second insulating layer on a bottom surface of the core layer, and a second electrode on a bottom surface of the second insulating layer, wherein a cavity is formed from a top surface of the embedded component substrate to expose the second insulating layer at a bottom of the cavity so that a top of cavity creates an opening on the top surface of the embedded component substrate;

a resin that covers inner side faces of the core layer that face the cavity; and a semiconductor device provided on the bottom of the cavity, a top of the semiconductor device being exposed by the opening of the embedded component substrate created by the cavity, wherein the second insulating layer has at least one first via positioned directly under the core layer, a front surface of said at least one first via being flush with a top surface of the second insulating layer that is in contact with the bottom surface of the core layer so that the first via is directly in contact with the core layer thereabove, wherein the second insulating layer has at least one second via positioned under the cavity, and wherein the semiconductor module further comprises a pad electrode directly on the second via in the cavity, adjacent to the semiconductor device provided on the bottom of the cavity, the pad electrode vertically protruding from a top surface of the exposed second insulating layer upwardly and being electrically connect to the semiconductor device.

8. The semiconductor module according to claim 7, wherein there is a gap between the resin that covers the inner side faces of the core layer facing the cavity and the semiconductor device.

* * * * *